US009640650B2

(12) United States Patent
Beam, III et al.

(10) Patent No.: US 9,640,650 B2
(45) Date of Patent: May 2, 2017

(54) DOPED GALLIUM NITRIDE HIGH-ELECTRON MOBILITY TRANSISTOR

(71) Applicant: TriQuint Semiconductor, Inc., Hillsboro, OR (US)

(72) Inventors: Edward A. Beam, III, Plano, TX (US); Jinqiao Xie, Allen, TX (US)

(73) Assignee: Qorvo US, Inc., Greensboro, NC (US)

( * ) Notice: Subject to any disclaimer, the term of this patent is extended or adjusted under 35 U.S.C. 154(b) by 75 days.

(21) Appl. No.: 14/157,245

(22) Filed: Jan. 16, 2014

(65) Prior Publication Data
US 2015/0200287 A1     Jul. 16, 2015

(51) Int. Cl.
| | |
|---|---|
| H01L 31/0256 | (2006.01) |
| H01L 29/15 | (2006.01) |
| H01L 29/66 | (2006.01) |
| H01L 21/20 | (2006.01) |
| H01L 21/36 | (2006.01) |
| H01L 29/778 | (2006.01) |
| H01L 29/205 | (2006.01) |
| H01L 21/02 | (2006.01) |
| H01L 29/20 | (2006.01) |

(52) U.S. Cl.
CPC ........ H01L 29/7787 (2013.01); H01L 29/205 (2013.01); H01L 29/66462 (2013.01); H01L 29/7785 (2013.01); H01L 21/0254 (2013.01); H01L 21/02458 (2013.01); H01L 21/02576 (2013.01); H01L 21/02584 (2013.01); H01L 29/2003 (2013.01)

(58) Field of Classification Search
CPC .................................................. H01L 29/7787
USPC .................................... 257/194, 76; 438/478
See application file for complete search history.

(56) References Cited

U.S. PATENT DOCUMENTS

| | | | | |
|---|---|---|---|---|
| 5,670,798 | A * | 9/1997 | Schetzina | H01L 29/205 257/101 |
| 5,679,965 | A * | 10/1997 | Schetzina | B82Y 20/00 257/103 |
| 6,064,082 | A * | 5/2000 | Kawai | H01L 29/7783 257/191 |
| 6,787,826 | B1 * | 9/2004 | Tserng et al. | 257/280 |
| 8,519,438 | B2 * | 8/2013 | Mishra et al. | 257/192 |
| 2003/0178633 | A1 * | 9/2003 | Flynn | H01L 29/155 257/101 |
| 2003/0218183 | A1 * | 11/2003 | Micovic | H01L 21/28575 257/192 |
| 2005/0077541 | A1 * | 4/2005 | Shen et al. | 257/194 |
| 2006/0145761 | A1 * | 7/2006 | Pribble | H03F 3/191 330/251 |
| 2006/0255364 | A1 * | 11/2006 | Saxler et al. | 257/192 |
| 2010/0270591 | A1 * | 10/2010 | Ahn | H01L 29/7782 257/194 |
| 2011/0233521 | A1 * | 9/2011 | Saxler | H01L 21/02458 257/24 |
| 2012/0007101 | A1 * | 1/2012 | Yang et al. | 257/76 |
| 2013/0032834 | A1 * | 2/2013 | Chen | H01L 33/007 257/94 |

(Continued)

Primary Examiner — Igwe U Anya
(74) Attorney, Agent, or Firm — Withrow & Terranova, P.L.L.C.

(57) ABSTRACT

Embodiments include high electron mobility transistors (HEMTs) comprising a substrate and a barrier layer including a doped component. The doped component may be a germanium doped layer or a germanium doped pulse. Other embodiments may include methods for fabricating such a HEMT.

12 Claims, 7 Drawing Sheets

(56) References Cited

U.S. PATENT DOCUMENTS

| | | | | |
|---|---|---|---|---|
| 2013/0032836 A1* | 2/2013 | Chen | ............... | H01L 33/62 |
| | | | | 257/95 |
| 2013/0032860 A1* | 2/2013 | Marino | ............ | H01L 29/66462 |
| | | | | 257/194 |
| 2013/0256683 A1* | 10/2013 | Imanishi | ............... | H01L 29/778 |
| | | | | 257/76 |

* cited by examiner

DOPED GALLIUM NITRIDE HIGH-ELECTRON MOBILITY TRANSISTOR

FIELD

Embodiments of the present disclosure generally relate to the field of circuits, and more particularly, to doped gallium nitride high-electron mobility transistors.

BACKGROUND

Conventional gallium nitride (GaN) high-electron mobility transistor (HEMT) structures are typically fabricated with a ternary or quaternary barrier layer. The barrier layer may be composed of indium (In), aluminum (Al), and/or gallium (Ga), for example, $In_xAl_yGa_{1-x-y}N$, where x and y indicate relative concentrations. The barrier layer may be epitaxially grown on a GaN channel/buffer layer. The barrier layer induces charge near the barrier/channel interface due to spontaneous polarization and/or piezoelectric effects. The density of this charge is strongly dependent on the composition of the barrier material and the surface condition. In some cases a large lattice mismatch stress must be accommodated to achieve the high charge densities needed for high performance device fabrication. These mismatch stresses, and high surface sensitivity, can lead to reliability limitations for such devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, disposed, or otherwise configured on a second layer," may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

Figure 1:
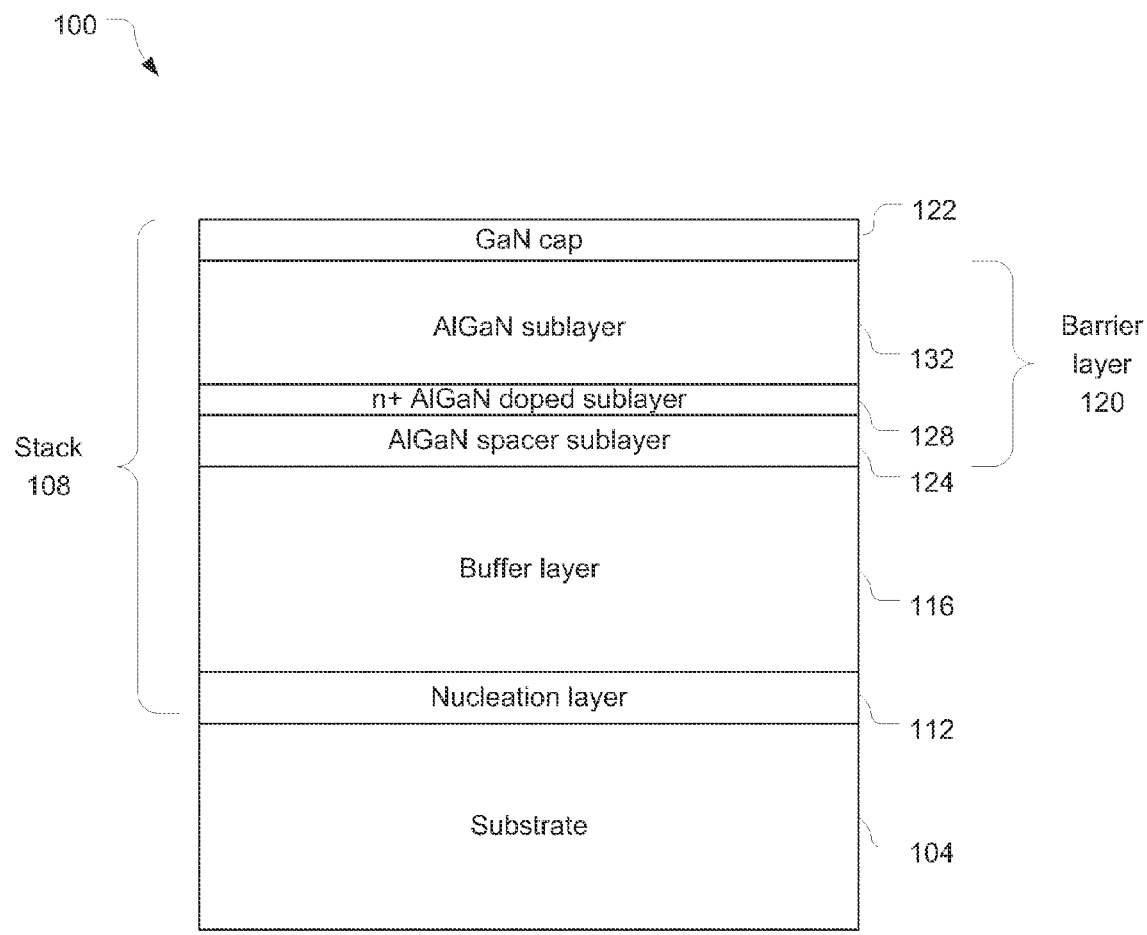
FIG. 1 schematically illustrates a cross-section view of a transistor layer structure, according to various embodiments.

FIG. 1 schematically illustrates a cross-sectional view of transistor layer structure 100 according to various embodiments. The transistor layer structure 100, or structure 100, may be part of a transistor, such as a HEMT device. The structure 100 may be fabricated on a substrate 104. A stack of layers (collectively referred to as stack 108) may be deposited on the substrate 104. The stack 108 may include layers of different material systems that form one or more heterojunctions/heterostructures. For example, the stack 108 may include a nucleation layer 112 disposed on the substrate 104, a buffer layer 116 disposed on the nucleation layer 112, a barrier layer 120 disposed on the buffer layer 116, and a cap 122 disposed on the barrier layer 120. In some embodiments, one or more of the layers of the stack 108 (e.g., the buffer layer 116 and/or barrier layer 120) may be epitaxially deposited.

The substrate 104 may include a support material upon which the stack 108 is deposited. In embodiments, the substrate 108 may include one or more of silicon (Si), silicon carbide (SiC), aluminum oxide ($Al_2O_3$) or "sapphire," gallium nitride (GaN), and/or aluminum nitride (AlN). Other materials including suitable group II-VI and group III-V semiconductor material systems can be used for the substrate 104 in other embodiments. In an embodiment, the substrate 104 may be composed of any material or combination of materials upon which materials of the stack 108 can be epitaxially grown.

In various embodiments, the nucleation layer 112 may be provided on the substrate 104 to promote growth of the other components of the stack 108 and/or to provide a desired transition between adjacent layers, for example, substrate 104 and buffer layer 116. The nucleation layer 112 may not be present in all embodiments.

In various embodiments, the buffer layer 116 may provide a crystal structure transition between the substrate 104 and other components of the stack 108, for example, the barrier layer 120, thereby acting as a buffer or isolation layer between the substrate 104 and other components of the structure 100. For example, the buffer layer 116 may provide stress relaxation between the substrate 104 and other lattice-mismatched materials, for example, the barrier layer 120. In some embodiments, the buffer layer 116 may serve as a channel for mobile charge carriers of the structure 100. The buffer layer 116 may be doped or undoped. The buffer layer 116 may be epitaxially coupled with the substrate 104 and/or nucleation layer 112. In some embodiments, the buffer layer 116 may be composed of a plurality of deposited films or layers.

In some embodiments, the buffer layer 116 may include a group III-nitride-based material such as, for example, gallium nitride (GaN), Aluminum Gallium Nitride (GaN), Indium Aluminum Gallium Nitride (InAlGaN), Indium Aluminum Gallium Boron Nitride (InAlGaBN), etc. The buffer layer 116 may have a thickness from 1 to 3 microns. Thickness dimensions, as used herein, may be in a direction that is substantially perpendicular to a major surface of the layer/sublayer. The buffer layer 116 may include other suitable materials and/or thicknesses in other embodiments.

In various embodiments, a heterojunction may be formed between the barrier layer 120 and the buffer layer 116. The barrier layer 120 may have a bandgap energy that is greater than a bandgap energy of the buffer layer 116. The barrier layer 120 may be a wider bandgap layer that supplies mobile charge carriers and the buffer layer 116 may be a narrower bandgap layer that provides a channel or pathway for the mobile charge carriers.

The barrier layer 120 may be primarily composed of three sublayers, AlGaN spacer sublayer 124, an n+ AlGaN doped sublayer 128, and an AlGaN sublayer 132. In some embodiments, the sublayers of barrier layer 120 may each have aluminum concentrations of approximately 15%. In some embodiments, the AlGaN spacer sublayer 124 may have a thickness of approximately 40 angstroms; the n+ AlGaN doped sublayer 128 may have a thickness of approximately 10 angstroms; and the AlGaN sublayer 132 may have a thickness of approximately 150 angstroms. Thicknesses and compositions (including noted doping and/or aluminum concentrations) may vary from what is explicitly described herein depending on targeted performance objectives of a particular embodiment.

In some embodiments, the AlGaN sublayer 132 may have different composition from that of the other layers of the barrier layer 120. This may be done to modify the band structure to enhance charge transfer to the channel.

The "n+" in the n+ AlGaN doped sublayer 128 may indicate that the doped sublayer 128 includes an n-type dopant in high doping concentration levels, for example, on the order of one or more dopant atoms per ten thousand atoms. The doped sublayer 128 may provide the structure 100 with a higher sheet charge density by allowing donated electrons to spill into the channel created by the conduction band offset between the barrier layer 120 and the buffer layer 116. This may, in turn, enable a reduction in the total stress in the stack 108 by facilitating use of materials in the barrier layer 120 that are less mismatched to the GaN buffer layer 116. For example, as discussed above, the barrier layer 120 may have an aluminum concentration of approximately 15%, which may be less mismatched to the GaN buffer layer 116 than conventional AlGaN barrier layers, which have higher aluminum concentrations, for example, 30%. The doped sublayer 128 may compensate for any charge lost due to a reduction in spontaneous polarization or piezoelectricity (from having materials that are more closely matched).

Germanium may be used as a dopant source, rather than silicon, to enable high doping concentrations. Use of high silicon doping concentrations, for example, greater than approximately $3\times10^{19}$ cm$^{-3}$, may be associated with an anti-surfactant effect that roughens a surface of the doped sublayer 128, which may be incompatible with high-mobility structures. Germanium, on the other hand, may be used as a dopant source to achieve high active doping concentrations greater than, for example, $3\times10^{20}$ cm$^{-3}$ while still maintaining a smooth surface morphology. In some embodiments, the doped sublayer 128 may have a doping concentration of approximately $5\times10^{19}$ cm$^{-3}$ or greater. Thus, a relatively thin doped sublayer 128 may be used to supply a substantial amount of sheet charge in addition to the charge supplied by spontaneous polarization or piezoelectric stress.

The AlGaN spacer sublayer 124 may be undoped and may reduce electron scattering from donor ions provided by the doped sublayer 128.

As device scaling geometries are reduced, moving the Schottky barrier closer to the channel may be important[41]. Recovering lost charge due to thinning of the barrier layer 120 may also be possible with this doping approach.

Figure 2:
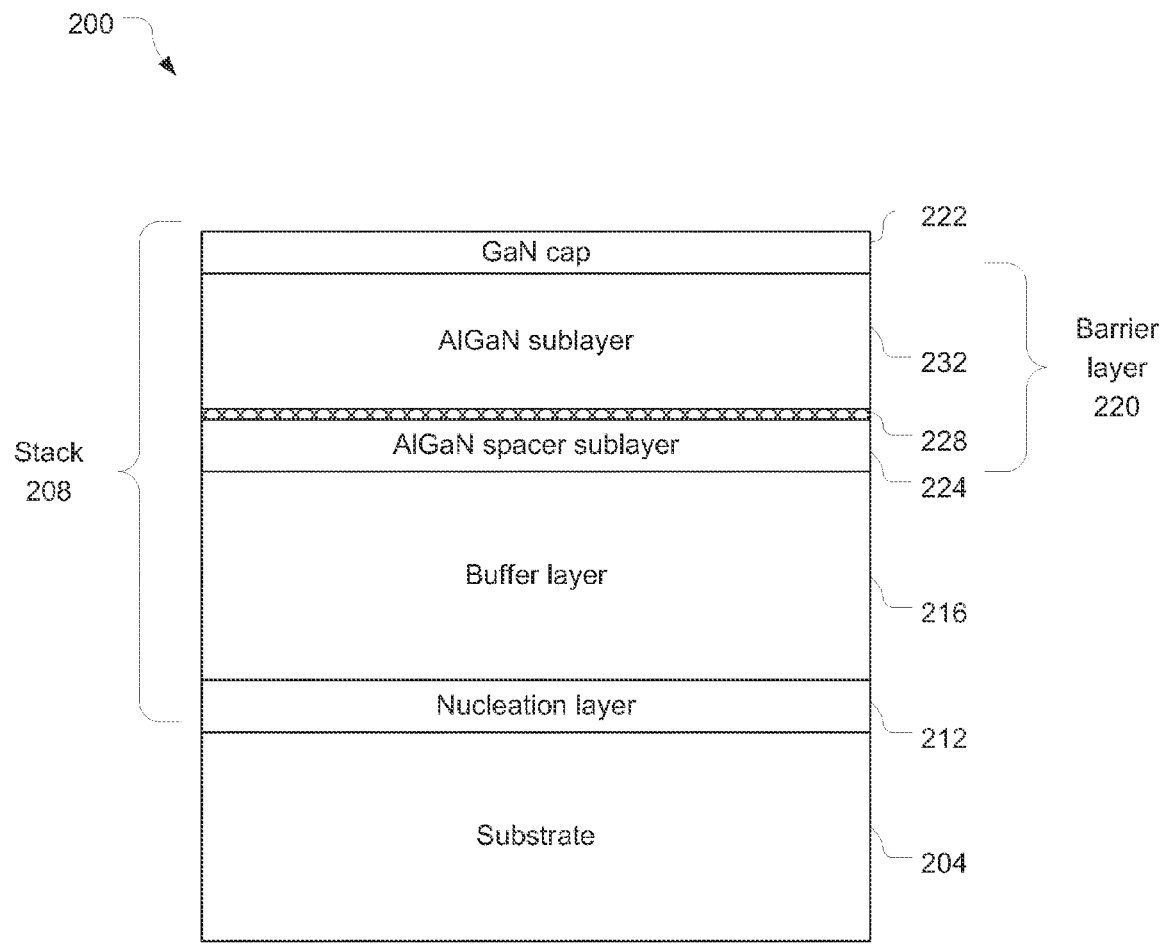
FIG. 2 schematically illustrates a cross-section view of another transistor layer structure, according to various embodiments.

FIG. 2 depicts an alternative embodiment of an structure 200. The structure 200 may be similar to structure 100 with like-named elements being substantially interchangeable unless otherwise noted.

Similar to the structure 100, the structure 200 may include a stack 208 disposed on a substrate 204. The stack 208 may include a nucleation layer 212, a buffer layer 216, an AlGaN spacer sublayer 224, an AlGaN sublayer 232, and a cap 222. These elements may be similar to the elements described above with respect to structure 100. However, instead of having a doped layer to enhance the sheet charge, the structure 200 may include a doped pulse 228. The doped pulse 228 may be a thin application of a dopant, for example, germanium, on a surface of the spacer sublayer 224. The doped pulse 228 may be considered a virtually zero-thickness sublayer. Similar to the doped sublayer 228, the doped pulse 228 may increase sheet charge of the structure while maintaining a desired smooth surface morphology.

Structures 100 and 200 may each include a single heterojunction, for example, between the barrier layer and the buffer layer. Other embodiments may include structures having more than one heterojunction, for example, double heterojunction structures.

Figure 3:
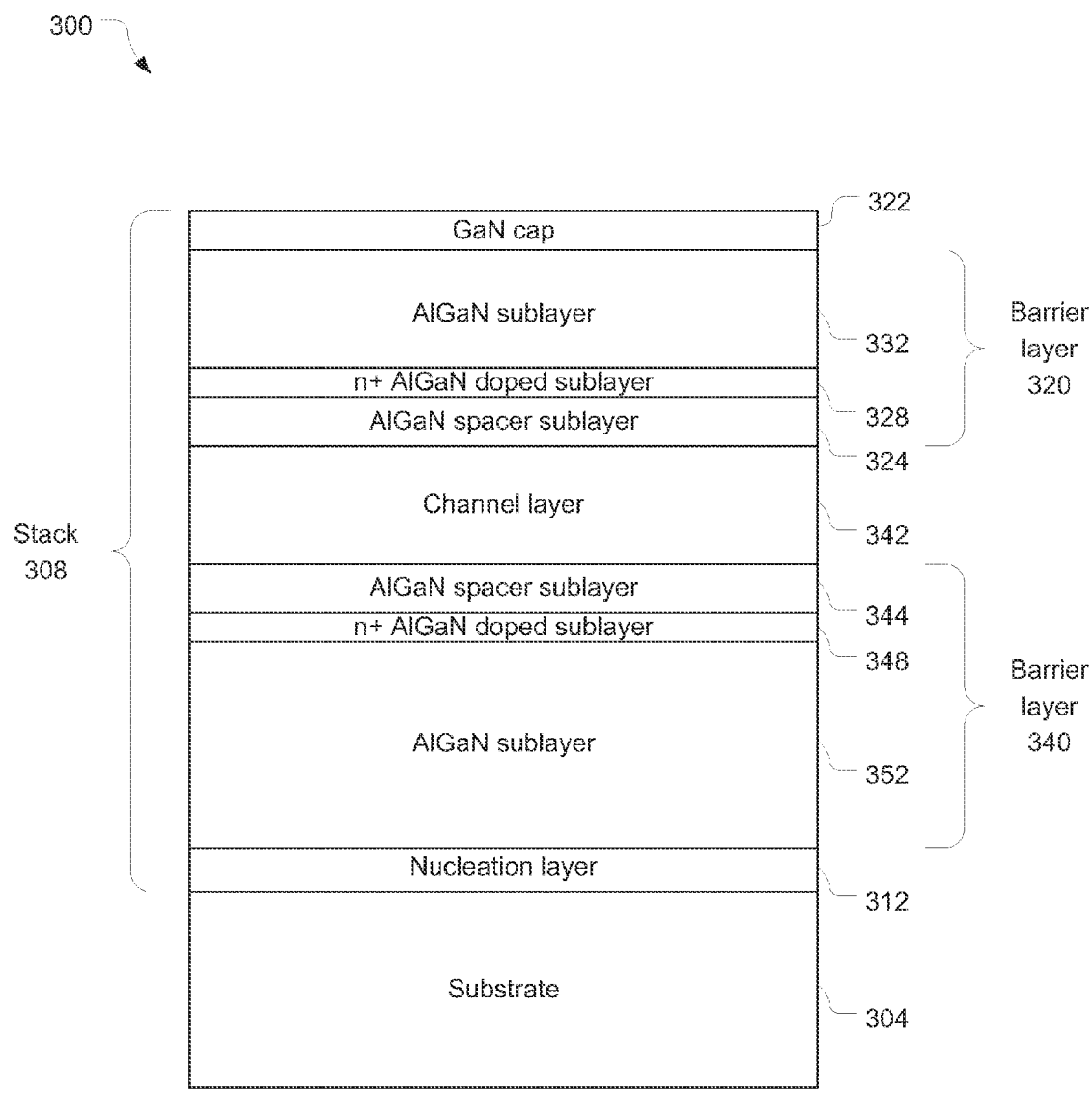
FIG. 3 schematically illustrates a cross-section view of another transistor layer structure, according to various embodiments.

FIG. 3 depicts an embodiment of a double heterojunction structure 300. The structure 300 may include a stack 308 disposed on a substrate 304, similar to structure 100, for example. However, the stack 308 of the structure 300 may include two barrier layers, for example, barrier layer 320 and barrier layer 340, disposed on either side of a channel layer 342. Each barrier layer may include similar sublayers. For example, barrier layer 320 may include an AlGaN spacer sublayer 324, an n+ AlGaN doped sublayer 328, and an AlGaN sublayer 332. Similarly, the barrier layer 340 may include AlGaN spacer sublayer 344, an n+ AlGaN doped sublayer 348, and an AlGaN sublayer 352.

The sublayers of the barrier layer 320 may generally have dimensions, compositions, and/or characteristics similar to the sublayers of barrier layer 120 described above. However, the sublayers of the barrier layer 340 may differ in dimensions, compositions, and/or characteristics in some embodiments. For example, the AlGaN spacer sublayer 344 may include an aluminum concentration of approximately 4% and may have a thickness of approximately 40 angstroms. The n+ AlGaN doped sublayer 348 may also have an aluminum concentration of approximately 4% and may have a thickness of approximately 10 angstroms. The lower aluminum concentrations of the barrier layer 320, with respect to barrier layer 340, may prevent a hole gas at the channel interface and/or may facilitate the band line-ups and charge in the channel layer 342.

Similar to description above with respect to sublayer 132, sublayers 332 and 352 may differ in compositions from other sublayers of barrier layers 320 and 340, respectively.

The n+ AlGaN doped sublayer 348 may include a germanium dopant with a doping concentration of approximately $5\times10^{19}$ cm$^{-3}$ or greater. In some embodiments, the AlGaN sublayer 352 may have an aluminum concentration of approximately 4% and may have a thickness of approximately 8,000 angstroms.

The channel layer 342 may be composed of GaN and may have a thickness of approximately 250 angstroms. An interface of the channel layer 342 with the barrier layer 320 may form a first heterojunction, while an interface of the channel layer 342 with the barrier layer 340 may form a second heterojunction.

Figure 4:
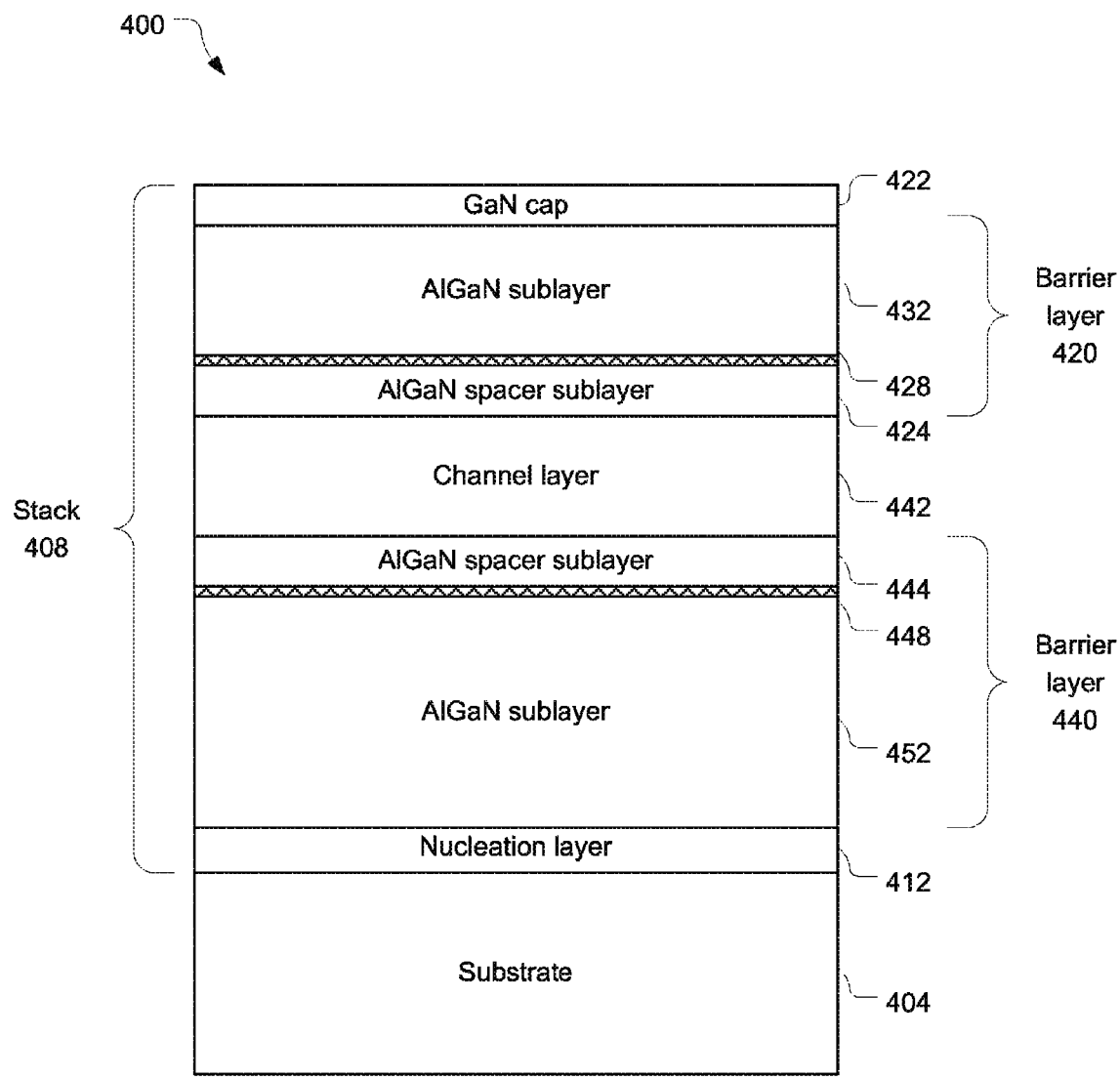
FIG. 4 schematically illustrates a cross-section view of another transistor layer structure, according to various embodiments.

FIG. 4 depicts another embodiment of a double heterojunction structure 400. The structure 300 may include a stack 408 on a substrate 404 similar to structure 200, for example. However, the stack 408 of the structure 400 may include two barrier layers, for example, barrier layer 420 and barrier layer 440, disposed on either side of a channel layer 442. Each barrier layer may include similar sublayers. For example, barrier layer 320 may include an AlGaN spacer sublayer 424, a doped pulse 428, and an AlGaN sublayer 432. Similarly, the barrier layer 340 may include AlGaN spacer sublayer 444, a doped pulse 448, and an AlGaN sublayer 452.

The sublayers of the barrier layer 420 may generally have dimensions, compositions, and/or characteristics similar to the sublayers of barrier layer 220 described above. However, the sublayers of the barrier layer 440 may differ in dimensions, compositions, and/or characteristics in some embodiments. For example, the AlGaN spacer sublayer 444 may include an aluminum concentration of approximately 4% and may have a thickness of approximately 40 angstroms. The AlGaN sublayer 452 may have an aluminum concentration of approximately 4% and may have a thickness of approximately 8,000 angstroms.

In various embodiments, transistors having the structures 100, 200, 300 and/or 400 may be used for Radio Frequency (RF), logic, and/or power conversion applications. For example, transistors having the structures 100, 200, 300 and/or 400 may provide an effective switch device for power-switch applications including power conditioning applications such as, for example, Alternating Current (AC)-Direct Current (DC) converters, DC-DC converters, DC-AC converters, and the like.

Figure 5:
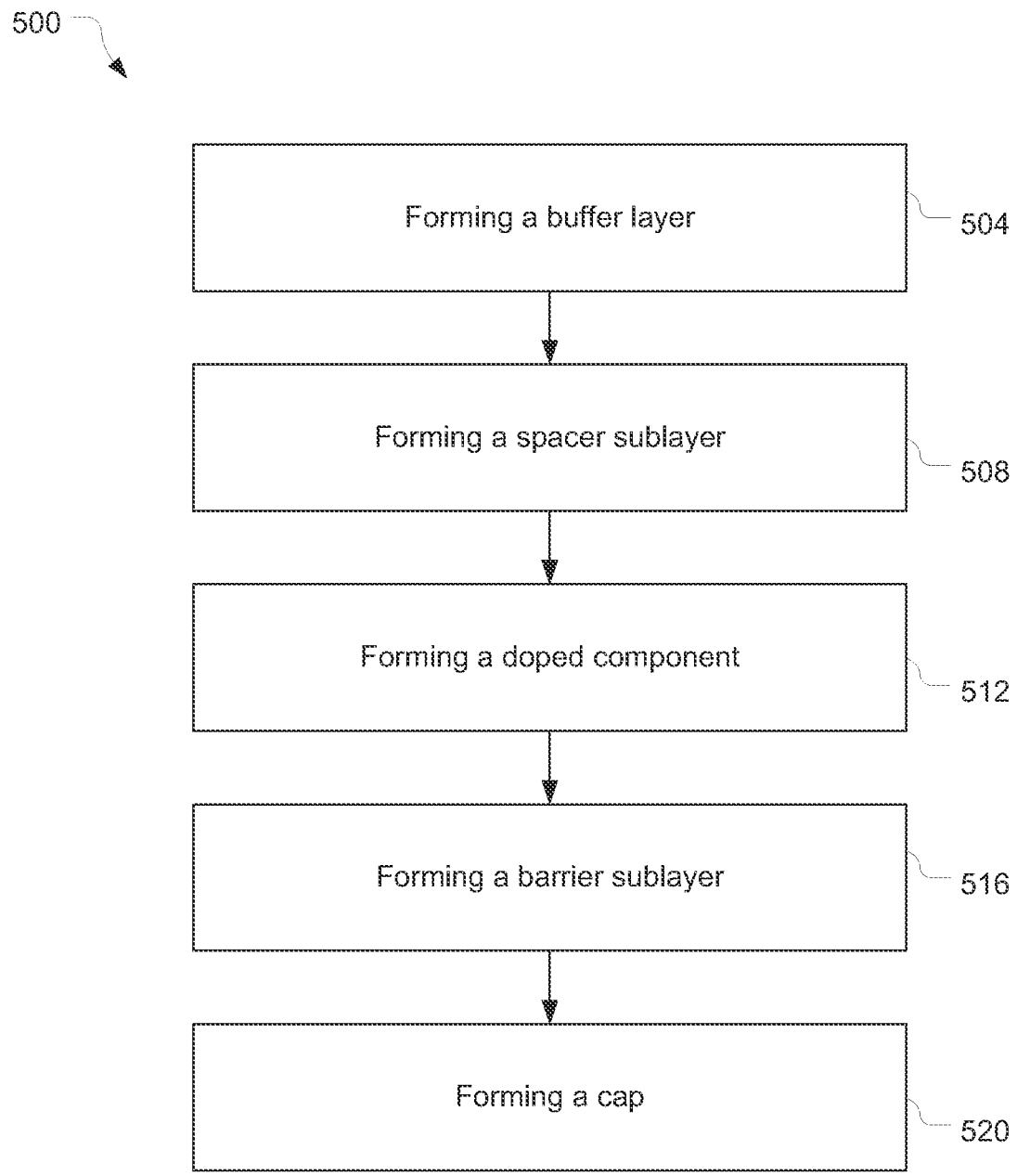
FIG. 5 is a flow diagram of a method for fabricating a transistor layer structure, according to various embodiments.

FIG. 5 is a flow diagram of a process 500 for fabricating a single heterojunction structure, for example, structure 100 or 200, according to various embodiments.

At 504, the process 500 may include forming a buffer layer (for example, buffer layer 116 or 216) on a substrate (for example, substrate 104 or 204). Forming the buffer layer may include epitaxially depositing a buffer layer material on the substrate. The buffer layer may be composed of multiple layers in some embodiments. As noted above, in some embodiments, the buffer layer may include GaN. In some embodiments, a nucleation layer (for example, nucleation layer 112 or 212) may be formed on the substrate, and the buffer layer may be formed on top of the nucleation layer.

The forming operations described herein may be any type of forming operation suitable for the materials and objectives of the particular semiconductor process. In some embodiments, the forming may include chemical vapor deposition (CVD), atomic layer deposition, metalorganic chemical vapor deposition (MOCVD), etc.

At 508, the process 500 may further include forming a spacer sublayer (for example, AlGaN spacer sublayer 124 or 224) on the buffer layer. As discussed above, the spacer sublayer may have an aluminum concentration of approximately 15% and may have a thickness of approximately 40 angstroms.

At 512, the process 500 may further include forming a doped component on the spacer sublayer. In some embodiments, the doped component may be a doped layer, for example, n+ AlGaN doped sublayer 128. As discussed above, the doped layer may have an aluminum concentration of approximately 15%, a germanium doping concentration of approximately $5\times10^{19}$ cm$^{-3}$ or greater and a thickness of approximately 10 angstroms. In some embodiments, the doped component may be a doped pulse, for example, doped pulse 228, in which a concentration of the selected dopant, for example, germanium, may be applied directly to the underlying spacer sublayer. Forming of a doped pulse may include deposition of germanium atoms on a surface (interface) during an epitaxial growth interruption.

In some embodiments, the doped component may be formed by a delta-doped process. A delta-doped process may use, for example, an MOCVD to obtain thin layers of high dopant concentration. In some embodiments, multiple growth steps may be used where the host material, for example, AlGaN, and dopant source, for example, germanium, are opened sequentially. In some embodiments, the host material may be opened continuously and the dopant source may be opened intermittently.

At 516, the process 500 may further include forming a barrier sublayer, for example, AlGaN sublayer 132 or 232, on top of the doped component. As discussed above, the barrier sublayer may be AlGaN having an aluminum concentration of approximately 15% and a thickness of approximately 150 angstroms.

At 520, the process 500 may further include forming a cap, for example, GaN cap 122 or 222. The cap may have a thickness of approximately 20 angstroms.

Figure 6:
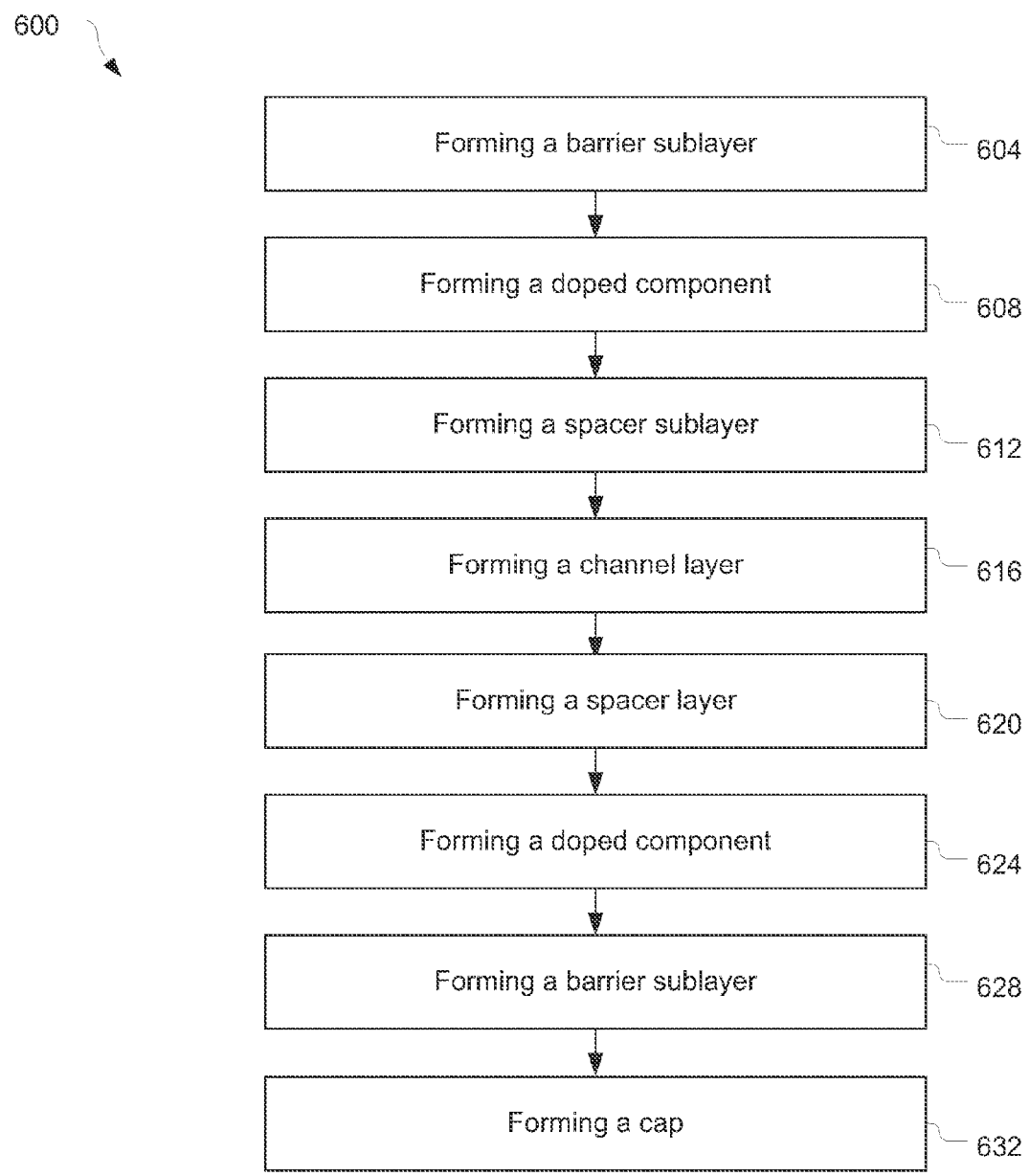
FIG. 6 is a flow diagram of a method for fabricating a transistor layer structure, according to various embodiments.

FIG. 6 is a flow diagram of a process 600 for fabricating a double heterojunction structure, for example, the structure 300 and/or 400, in accordance with some embodiments.

At 604, the process 600 may include forming a barrier sublayer, for example, a AlGaN sublayer 352 or 452, on a substrate, for example, substrate 304 or 404. Forming the barrier sublayer may include epitaxially depositing a sublayer material on the substrate. As noted above, in some embodiments, the barrier sublayer may include AlGaN and may have an aluminum concentration of approximately 4% and a thickness of approximately 8000 angstroms. In some embodiments, a nucleation layer, for example, nucleation layer 312 or 412, may be formed on the substrate, and the barrier sublayer may be formed on top of the nucleation layer.

At 608, the process 600 may further include forming a doped component on the barrier sublayer. In some embodiments, the doped component may be a doped layer, for example, n+ AlGaN doped sublayer 348. The doping of the doped layer may be performed as described above. As further discussed above, the doped layer may have an aluminum concentration of approximately 4%, a germanium doping concentration of approximately $5\times10^{19}$ cm$^{-3}$ or greater, and may have a thickness of approximately 10 angstroms in some embodiments.

In some embodiments, the doped component may be a doped pulse, for example, doped pulse 448. In these embodiments, a concentration of the selected dopant, for example, germanium, may be applied directly to the underlying barrier sublayer.

At 612, the process 600 may further include forming a spacer sublayer, for example, AlGaN spacer sublayer 344 or 224, on the barrier sublayer. The spacer sublayer may be AlGaN with an aluminum concentration of approximately 4% and a thickness of approximately 40 angstroms in some embodiments.

At 616, the process 600 may include forming a channel layer, for example, channel layer 342 or 442. The channel layer, as discussed above, may be composed of GaN and may have a thickness of approximately 250 angstroms in some embodiments.

At 620, the process 600 may include forming a spacer layer, for example, spacer layer 324 or 424. The spacer layer, as discussed above, may be composed of AlGaN, may have an aluminum concentration of approximately 15%, and may have a thickness of approximately 40 angstroms in some embodiments.

At 624, the process 600 may include forming a doped component on the spacer sublayer. In some embodiments, the doped component may be a doped layer, for example, n+ AlGaN doped sublayer 328. The doping of the doped layer may be performed as described above. As discussed above, the doped layer may have an aluminum concentration of approximately 15%, a germanium doping concentration of approximately $5 \times 10^{19}$ cm$^{-3}$ or greater, and may have a thickness of approximately 10 angstroms in some embodiments.

In some embodiments, the doped component may be a doped pulse, for example, doped pulse 428. In these embodiments, a concentration of the selected dopant, for example, germanium, may be applied directly to the underlying spacer sublayer.

At 628, the process 600 may further include forming a barrier sublayer, for example, AlGaN sublayer 332 or 432, on the doped component. As discussed above, the barrier sublayer may be composed of AlGaN, may have an aluminum concentration of approximately 15%, and may have a thickness of approximately 150 angstroms in some embodiments.

At 632, the process 600 may further include forming a cap, for example, GaN cap 322 or 422. As discussed above, the cap may be composed of GaN and may have a thickness of approximately 20 angstroms in some embodiments.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 7:
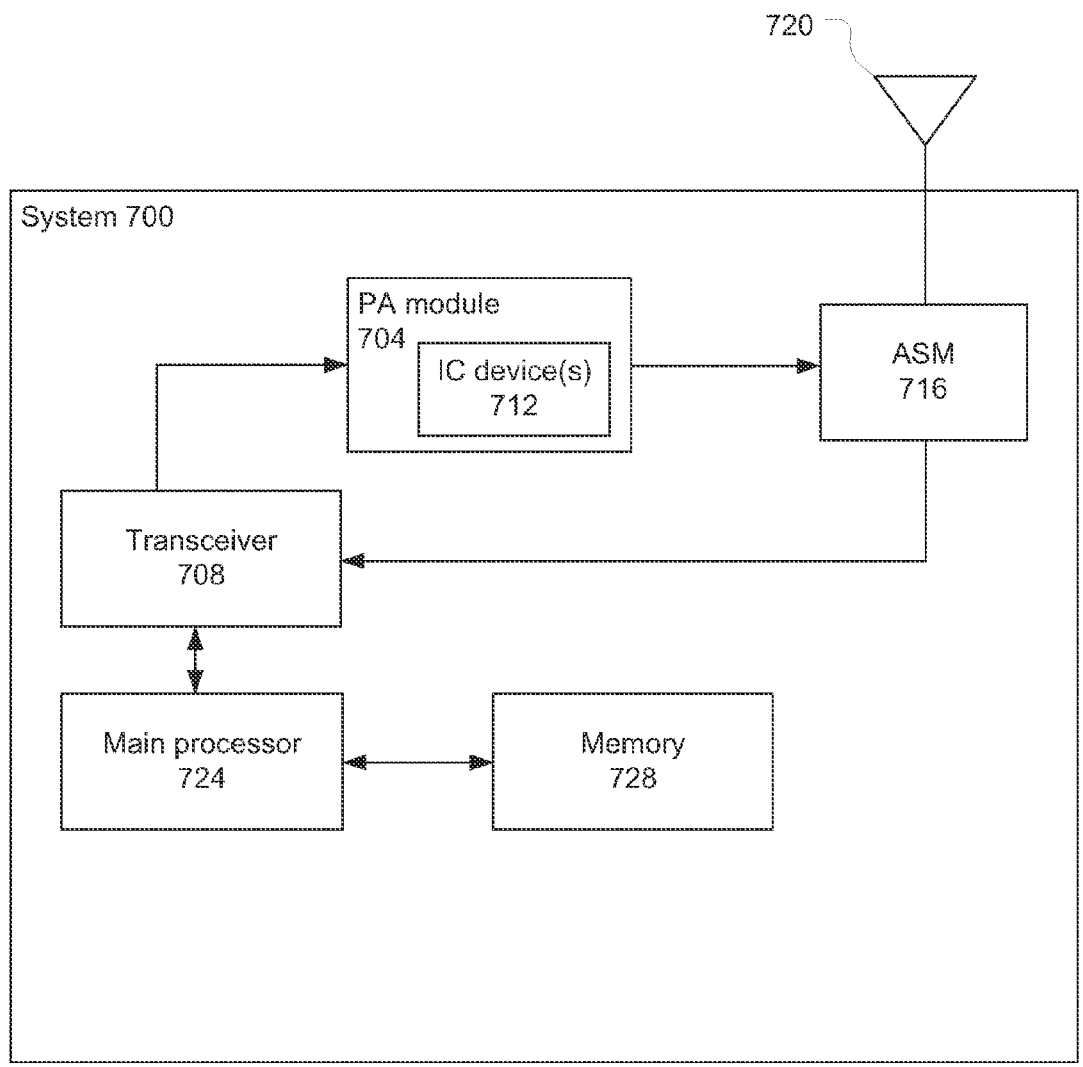
FIG. 7 schematically illustrates an example system, according to various embodiments.

Transistors having structures, for example, the structures 100, 200, 300 and/or 400, described herein, and apparatuses including such transistors may be incorporated into various other apparatuses and systems. A block diagram of an example system 700 is illustrated in FIG. 7. As illustrated, the system 700 includes a power amplifier (PA) module 704, which may be a Radio Frequency (RF) PA module in some embodiments. The system 700 may include a transceiver 708 coupled with the power amplifier module 704 as illustrated. The PA module 704 may include one or more transistors 712 having, for example, structures 100, 200, 300 and/or 400. In some embodiments, the transistors 712 may be in additional/alternative components of the system 700.

The power amplifier module 704 may receive an RF input signal from the transceiver 708. The power amplifier module 704 may amplify the RF input signal to provide an amplified RF output signal to an antenna switch module (ASM) 716. The ASM 716 may effectuate an over-the-air (OTA) transmission of the amplified RF output signal via an antenna structure 720. The ASM 716 may also receive RF signals via the antenna structure 720 and couple the received RF signals to the transceiver 708 along a receive chain that may include, for example, low noise amplifiers, filters, etc.

In various embodiments, the antenna structure 720 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 700 may also include a main processor 724 to execute a basic operating system program stored in memory 728 in order to control the overall operation of the system 700. For example, the main processor 724 may control the reception of signals and the transmission of signals by transceiver 708. The main processor 724 may be capable of executing other processes and programs resident in the memory 728 and may move data into or out of the memory as desired by an executing process.

The system 700 may be any system including power amplification. The transistors 712 may provide an effective switch device for power-switch applications including power conditioning applications such as, for example, Alternating Current (AC)-Direct Current (DC) converters, DC-DC converters, DC-AC converters, and the like. In various embodiments, the system 700 may be particularly useful for power amplification at high radio frequency power and frequency. For example, the system 700 may be suitable for any one or more of terrestrial and satellite communications, radar systems, and possibly in various industrial and medical applications. More specifically, in various embodiments, the system 500 may be a selected one of a radar device, a satellite communication device, a mobile handset, a cellular telephone base station, a broadcast radio, or a television amplifier system.

Various example embodiments are described below.

Example 1 includes an apparatus comprising: a substrate; a gallium nitride (GaN) buffer layer disposed on the substrate; and an aluminum gallium nitride (AlGaN) barrier layer disposed on the GaN buffer layer, the AlGaN barrier layer including a doped component.

Example 2 includes the apparatus of example 1, wherein the doped component includes a doped pulse.

Example 3 includes the apparatus of example 1, wherein the doped component includes a doped layer.

Example 4 includes the apparatus of example 3, wherein the doping layer has a thickness of approximately 10 angstroms.

Example 5 includes the apparatus of example 3, wherein the doped layer is doped with germanium.

Example 6 includes the apparatus of example 5, wherein the doping concentration is approximately $5 \times 10^{19}$ cm$^{-3}$ or greater.

Example 7 includes the apparatus of example 1, wherein the AlGaN barrier layer includes an aluminum concentration of approximately 15%.

Example 8 includes the apparatus of example 1, wherein the AlGaN barrier layer further includes a spacer sublayer between the doped component and the GaN buffer layer.

Example 9 includes an apparatus comprising: a first aluminum gallium nitride (AlGaN) barrier layer; a gallium nitride (GaN) channel layer coupled with the first barrier layer to form a first heterojunction; and a second AlGaN barrier layer coupled with the channel layer to form a second heterojunction, wherein the first or second AlGaN barrier layer includes a doped component.

Example 10 includes the apparatus of example 9, wherein the first AlGaN barrier layer includes a first doped component and the second AlGaN barrier layer includes a second doped component.

Example 11 includes the apparatus of example 10, wherein the first and second doped components include first and second doped layers, respectively.

Example 12 includes the apparatus of example 11, wherein the first doped layer includes an aluminum concentration of approximately 15%, a germanium doping concentration of approximately $5 \times 10^{19}$ cm$^{-3}$ or greater, and a thickness of approximately 10 angstroms.

Example 13 includes the apparatus of example 11, wherein the second doped layer includes an aluminum concentration of approximately 4%, a germanium doping concentration of approximately $5 \times 10^{19}$ cm$^{-3}$ or greater, and a thickness of approximately 10 angstroms.

Example 14 includes the apparatus of example 10, wherein the first and second doped components include first and second doping pulses.

Example 15 includes the apparatus of example 9, wherein the first AlGaN barrier layer includes an aluminum concentration of approximately 15% and the second AlGaN barrier layer includes an aluminum concentration of approximately 4%.

Example 16 includes a method comprising: forming a gallium nitride (GaN) buffer layer; forming an aluminum gallium nitride (AlGaN) barrier layer on the GaN buffer layer, wherein forming the AlGaN barrier layer includes forming a doped component using a germanium dopant.

Example 17 includes the method of example 16, wherein forming the doped component includes: forming a doped layer with a doping concentration of approximately $5 \times 10^{19}$ cm$^{-3}$ or greater.

Example 18 includes the method of example 16, wherein forming the doped component includes: forming a doped pulse.

Example 19 includes a method comprising: forming a first aluminum gallium nitride (AlGaN) barrier layer on a substrate; forming a gallium nitride (GaN) channel on the first AlGaN barrier layer; forming a second AlGaN barrier layer on the GaN channel, wherein forming the first or the second AlGaN barrier layer includes forming a doped component.

Example 20 includes the method of example 19, wherein forming the doped component includes: forming a doped layer with a doping concentration of approximately $5 \times 10^{19}$ cm$^{-3}$ or greater.

Example 21 includes the method of example 16, wherein forming the doped component includes: forming a doped pulse.

Example 22 includes a system comprising: a transceiver to generate RF signals; and a power amplifier module coupled with the transceiver to amplify the RF signals from the transceiver and to provide amplified RF signals to an antenna switch module, wherein the power amplifier module includes a high-electron mobility transistor (HEMT) comprising: a substrate; and an aluminum gallium nitride (AlGaN) barrier layer disposed on the substrate, the AlGaN barrier layer including a germanium doped component.

Example 23 includes the system of example 22, wherein the HEMT includes a single heterojunction or a double heterojunction.

Example 24 includes the system of example 22, wherein the AlGaN barrier layer includes an aluminum concentration of approximately 15%.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:
1. An apparatus comprising:
a first aluminum gallium nitride (AlGaN) barrier layer that comprises a first AlGaN sublayer and a first AlGaN spacer sublayer, and
a first doped component between the first AlGaN sublayer and the AlGaN spacer sublayer
a gallium nitride (GaN) channel layer coupled with the first barrier layer to form a first heterojunction;
a second AlGaN barrier layer coupled with the channel layer to form a second heterojunction,
wherein the second AlGaN barrier layer comprises a second AlGaN sublayer and a second AlGaN spacer sublayer; and
a second doped component between the second AlGaN sublayer and the second AlGaN spacer sublayer.

2. The apparatus of claim 1, wherein the first and second doped components include first and second doped layers, respectively.

3. The apparatus of claim 2, wherein the first doped layer includes an aluminum concentration of approximately 15%, a germanium doping concentration of approximately $5 \times 10^{19}$ cm$^{-3}$ or greater, and a thickness of approximately 10 angstroms.

4. The apparatus of claim 2, wherein the second doped layer includes an aluminum concentration of approximately 4%, a germanium doping concentration of approximately $5 \times 10^{19}$ cm$^{-3}$ or greater, and a thickness of approximately 10 angstroms.

5. The apparatus of claim 1, wherein the first and second doped components include first and second doping pulses.

6. The apparatus of claim 1, wherein the first AlGaN barrier layer includes an aluminum concentration of approximately 15% and the second AlGaN barrier layer includes an aluminum concentration of approximately 4%.

7. A method comprising:
forming a first aluminum gallium nitride (AlGaN) barrier layer on a substrate, wherein the first AlGaN barrier layer comprises a first AlGaN sublayer and a first AlGaN spacer sublayer, and;
forming a first doped component between the first AlGaN sublayer and the AlGaN spacer sublayer;
forming a gallium nitride (GaN) channel on the first AlGaN barrier layer;
forming a second AlGaN barrier layer that comprises a second AlGaN sublayer and a second AlGaN spacer sublayer on the GaN channel; and forming a second doped component between the second AlGaN sublayer and the second AlGaN spacer sublayer.

8. The method of claim 7, wherein forming the first doped component includes:
forming a doped layer with a doping concentration of approximately $5 \times 10^{19}$ cm$^{-3}$ or greater.

9. The method of claim 7, wherein forming the first doped component includes:
forming a doped pulse.

10. A system comprising:
a transceiver to generate RF signals; and
a power amplifier module coupled with the transceiver to amplify the RF signals from the transceiver and to provide amplified RF signals to an antenna switch module, wherein the power amplifier module includes a high-electron mobility transistor (HEMT) comprising:
a substrate;
a first aluminum gallium nitride (AlGaN) barrier layer disposed on the substrate, and comprising a first AlGaN sublayer and a first AlGaN spacer sublayer;
a first doped component between the first AlGaN sublayer and the first AlGaN spacer sublayer;
a channel layer disposed on the first AlGaN sublayer;
a second aluminum gallium nitride (AlGaN) barrier layer disposed on the channel layer, and comprising a second AlGaN sublayer and a second AlGaN spacer sublayer; and
a second doped component between the second AlGaN sublayer and the second AlGaN spacer sublayer.

11. The system of claim 10, wherein the first doped component and the second doped component are both germanium.

12. The system of claim 10, wherein at least one of the first AlGaN barrier layer and the second AlGaN barrier layer includes an aluminum concentration of approximately 15%.

* * * * *